United States Patent
Liang et al.

(10) Patent No.: US 12,310,208 B2
(45) Date of Patent: May 20, 2025

(54) CONNECTING SUBSTRATE, FABRICATION METHOD, SPLICING SCREEN AND DISPLAY APPARATUS

(71) Applicant: BOE TECHNOLOGY GROUP CO., LTD., Beijing (CN)

(72) Inventors: Shuang Liang, Beijing (CN); Muxin Di, Beijing (CN); Zhiwei Liang, Beijing (CN); Ke Wang, Beijing (CN); Zhanfeng Cao, Beijing (CN); Yingwei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 646 days.

(21) Appl. No.: 17/630,631

(22) PCT Filed: Apr. 29, 2021

(86) PCT No.: PCT/CN2021/091003
§ 371 (c)(1),
(2) Date: Jan. 27, 2022

(87) PCT Pub. No.: WO2021/238570
PCT Pub. Date: Dec. 2, 2021

(65) Prior Publication Data
US 2022/0262891 A1    Aug. 18, 2022

(30) Foreign Application Priority Data
May 26, 2020   (CN) .......................... 202010456460.0

(51) Int. Cl.
*H10K 59/18*   (2023.01)
*G02F 1/1333*  (2006.01)
(Continued)

(52) U.S. Cl.
CPC ......... *H10K 59/18* (2023.02); *G02F 1/13336* (2013.01); *G06F 3/1423* (2013.01); *G06F 3/1446* (2013.01); *H10K 59/1201* (2023.02)

(58) Field of Classification Search
CPC ... G02F 1/13336; G06F 3/1423; G06F 3/1446
See application file for complete search history.

(56) References Cited

U.S. PATENT DOCUMENTS 7,928,552 B1 * 4/2011 Cho ................... H01L 23/49827
257/E23.142
2011/0241029 A1   10/2011 An
(Continued)

FOREIGN PATENT DOCUMENTS

CN   106505089 A   3/2017
CN   107479229 A   12/2017
(Continued)

OTHER PUBLICATIONS

China Patent Office, First Office Action dated Jul. 28, 2021, for corresponding Chinese application No. 202010456460.0.
(Continued)

*Primary Examiner* — Matthew L Reames
(74) *Attorney, Agent, or Firm* — HOUTTEMAN LAW LLC (57) ABSTRACT

Disclosed are a connecting substrate and a fabrication method, a splicing screen, and a display apparatus. The connecting substrate has panel areas (10) and connecting areas (30) connecting every two adjacent panel areas (10), each panel area including a display area (20) surrounded by the connecting areas (30). The connecting substrate includes, in connecting area: a base (101); connecting wirings (102) on the base (101); an insulating layer (103) covering the plurality of connecting wirings (102) and defining a groove (106) for accommodating a display panel (107) to be spliced; through holes (105) penetrating the
(Continued)

insulating layer (103); and connecting electrodes (104) respectively provided in the through holes (105) and coupled to the connecting wirings (102) in one-to-one correspondence. The connecting electrodes (104) are coupled to first pads (P1) on light-emitting surface of the display panel (107) to be spliced in one-to-one correspondence.

15 Claims, 5 Drawing Sheets

(51) Int. Cl.
*G06F 3/14* (2006.01)
*H10K 59/12* (2023.01)

(56) References Cited

U.S. PATENT DOCUMENTS

| | | | |
|---|---|---|---|
| 2017/0131583 A1 | 5/2017 | Liu et al. | |
| 2018/0358385 A1 | 12/2018 | Bae et al. | |
| 2020/0111391 A1 | 4/2020 | Chao et al. | |
| 2021/0066672 A1 | 3/2021 | Dai | |
| 2021/0335981 A1 | 10/2021 | Zhang | |

FOREIGN PATENT DOCUMENTS

| | | |
|---|---|---|
| CN | 108897177 A | 11/2018 |
| CN | 208607862 U | 3/2019 |
| CN | 110265447 A | 9/2019 |
| CN | 110323231 A | 10/2019 |
| CN | 110473835 A | 11/2019 |
| CN | 210324961 U | 4/2020 |
| CN | 111105720 A | 5/2020 |
| CN | 111583812 A | 8/2020 |

OTHER PUBLICATIONS

China Patent Office, Second Office Action dated Apr. 6, 2022, for corresponding Chinese application No. 202010456460.0.

* cited by examiner

CONNECTING SUBSTRATE, FABRICATION METHOD, SPLICING SCREEN AND DISPLAY APPARATUS

CROSS-REFERENCE TO RELATED APPLICATIONS

This is a National Phase Application filed under 35 U.S.C. 371 as a national stage of PCT/CN2021/091003, filed on Apr. 29, 2021, an application claiming priority from Chinese patent application No. 202010456460.0 filed on May 26, 2020, the disclosure of which is incorporated herein by reference.

TECHNICAL FIELD

The present disclosure relates to the field of display technology, and specifically relates to a connecting substrate and a fabrication method, a splicing screen, and a display apparatus.

BACKGROUND

With the continuous development of the display technology, indoor larger display panels have been widely used. Nowadays, in order for display on a larger display panel, a plurality of smaller display panels are generally spliced to form a larger splicing screen.

SUMMARY

In one aspect, the present disclosure provides a connecting substrate having a plurality of panel areas and connecting areas configured to connect every two adjacent panel areas among the plurality of panel areas, each panel area including a display area surrounded by the connecting areas. The connecting substrate includes, in each connecting area: a base; a plurality of connecting wirings on the base; an insulating layer configured to cover the plurality of connecting wirings and define a groove for accommodating a display panel to be spliced; a plurality of through holes configured to penetrate the insulating layer; and a plurality of connecting electrodes respectively provided in the plurality of through holes and coupled to the plurality of connecting wirings in one-to-one correspondence. The plurality of connecting electrodes are coupled to first pads on a light-emitting surface of the display panel to be spliced in one-to-one correspondence.

In an embodiment, a depth of the groove is equal to a thickness of the display panel to be spliced.

In an embodiment, the insulating layer includes a polyimide layer and a silicon nitride layer disposed in stack; the polyimide layer is closer to the base than the silicon nitride layer; and the groove penetrates the silicon nitride layer and is in the polyimide layer.

In an embodiment, a material of the connecting electrode includes copper.

In an embodiment, the base includes a flexible base.

In an embodiment, in each connecting area, the connecting substrate includes two columns of connecting electrodes, one column of connecting electrodes are electrically coupled to the first pads on the light-emitting surface of the display panel to be spliced, and the other column of connecting electrodes are electrically coupled to first pads on a light-emitting surface of a further display panel to be spliced, which is adjacent to the display panel to be spliced.

In an embodiment, in each connecting area, the plurality of connecting wirings include two columns of connecting wirings, and each of the two columns of connecting wirings extends in a direction perpendicular to a column direction.

In another aspect, the present disclosure provides a splicing screen, including a connecting substrate according to any embodiment of the present disclosure.

In an embodiment, the splicing screen further includes a plurality of display panels; where each of the plurality of display panels is located in the groove; first pads on a light-emitting surface of each of the plurality of display panels are coupled to the plurality of connecting electrodes in the connecting substrate in one-to-one correspondence; the first pads on the light-emitting surface of each of the plurality of display panels are electrically coupled to display devices in the display panel; and the plurality of connecting wirings are electrically coupled to a drive chip for driving the display panel.

In an embodiment, a size of the display panel in a first direction parallel to a front face of the display panel is 2 to 10 times a size of the groove in the first direction.

In an embodiment, the display panel includes an active matrix organic light-emitting diode display panel or a passive matrix organic light-emitting diode display panel.

In another aspect, the present disclosure provides a display device, including a splicing screen according to any embodiment of the present disclosure.

In another aspect, the present disclosure provides a method for fabricating a connecting substrate that has a plurality of panel areas and connecting areas configured to connect every two adjacent panel areas among the plurality of panel areas, each panel area including a display area surrounded by the connecting areas, and the connecting substrate including, in each connecting area: a base; a plurality of connecting wirings on the base; an insulating layer configured to cover the plurality of connecting wirings and define a groove for accommodating a display panel to be spliced; a plurality of through holes configured to penetrate the insulating layer; and a plurality of connecting electrodes respectively provided in the plurality of through holes and coupled to the plurality of connecting wirings in one-to-one correspondence, wherein the connecting electrodes are coupled to first pads on a light-emitting surface of the display panel to be spliced in one-to-one correspondence, the method for fabricating a connecting substrate including:

forming a seed layer on the base, and patterning the seed layer to form the plurality of connecting wirings;

forming the insulating layer covering the plurality of connecting wirings, and patterning the insulating layer to form the plurality of through holes in the connecting area;

forming the plurality of connecting electrodes in the plurality of through holes, wherein the plurality of connecting electrodes are coupled to the plurality of connecting wirings in one-to-one correspondence through the plurality of through holes; and     patterning the insulating layer to form the groove in the display area.

In an embodiment, the forming the insulating layer covering the plurality of connecting wirings includes:

forming a polyimide layer on the plurality of connecting wirings; and     forming a silicon nitride layer on the polyimide layer.

In an embodiment, the patterning the insulating layer to form the plurality of through holes in the connecting area includes:

patterning the silicon nitride layer to form a plurality of etching holes; and processing the polyimide layer through oxygen ashing process by using the patterned silicon nitride layer as a mask to form the plurality of through holes in the connecting area.

DETAIL DESCRIPTION OF EMBODIMENTS

To improve understanding of the technical solution of the present disclosure for those skilled in the art, the present disclosure will now be described in detail with reference to accompanying drawings and specific embodiments.

There are at least the following problems in the conventional art: during the process of splicing a plurality of smaller display panels, generally no connecting structure is adopted and a certain space needs to be reserved between adjacent smaller display panels for a signal wiring, leading to a relatively large spacing between the adjacent smaller display panels, which may easily cause dark fringes at the spliced position, reduce the display effect of the spliced large-size splicing screen, and thus affect the user experience.

Figure 1:
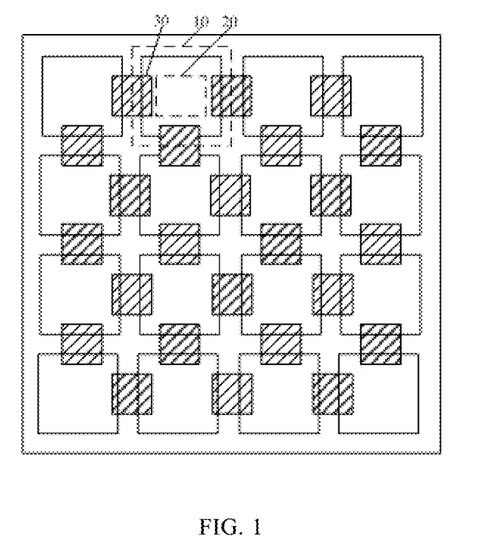
FIG. 1 is a schematic diagram showing a planar structure of a connecting substrate according to an embodiment of the present disclosure.
Figure 2:
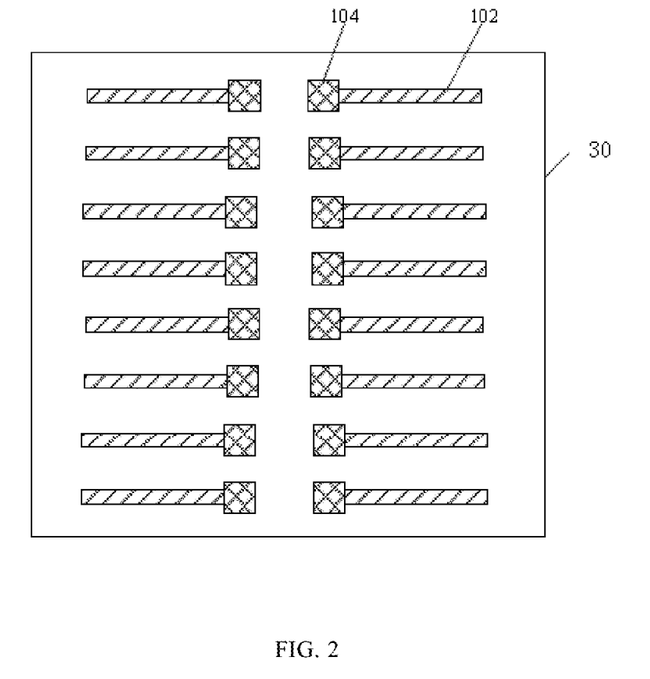
FIG. 2 is a schematic diagram showing a partial planar structure of a connecting substrate according to an embodiment of the present disclosure.
Figure 3:
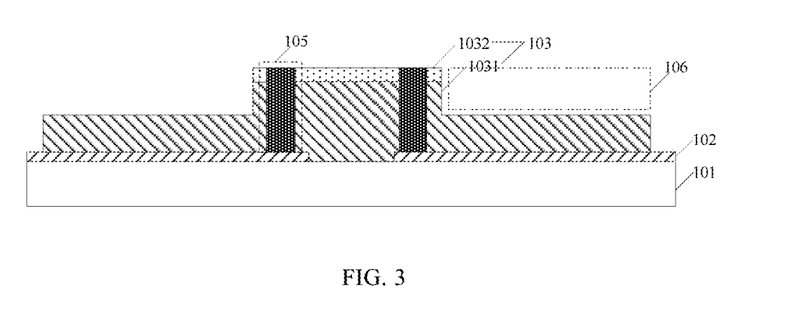
FIG. 3 is a schematic diagram showing a partial sectional structure of a connecting substrate according to an embodiment of the present disclosure.

FIG. 1 is a schematic diagram showing a planar structure of a connecting substrate according to an embodiment of the present disclosure. In an embodiment, the connecting substrate is configured to splice a plurality of display panels to form a larger display panel. As shown in FIG. 1, the connecting substrate has a plurality of panel areas 10. Each panel area 10 includes a display area 20 and a connecting area 30 around the display area 20. FIG. 2 is a schematic diagram showing a partial planar structure of a connecting substrate according to an embodiment of the present disclosure; and FIG. 3 is a schematic diagram showing a partial sectional structure of a connecting substrate according to an embodiment of the present disclosure. As shown in FIGS. 2 and 3, the connecting substrate includes: a base 101, a plurality of connecting wirings 102, an insulating layer 103, and a plurality of connecting electrodes 104. The plurality of connecting wirings 102 are disposed on the base 101 and located in the connecting areas 30. The insulating layer 103 covers the plurality of connecting wirings 102 and is provided with a plurality of through holes 105 and a plurality of grooves 106. The plurality of through holes 105 are located in the connecting areas 30, and the grooves 106 are located in the panel areas 10. In an embodiment, referring to FIG. 2, each connecting area 30 may be provided with two columns of connecting electrodes 104, one column of connecting electrodes 104 are electrically coupled to display panels 107 (e.g., via first pads P1) on a display area 20, and the other column of connecting electrodes 104 are electrically coupled to display panels 107 (e.g., via first pads P1) on another display area 20, which is adjacent to the above display area 20. In an embodiment, each connecting area may be provided with two columns of connecting wirings 102, each of which extends in a first direction D1 parallel to the surface of the base 101, and each column of connecting wirings 102 are arranged along a second direction perpendicular to the first direction D1.

In an embodiment, the connecting electrodes 104 are disposed in the through holes 105, and the connecting electrodes 104 pass through the through holes 105 to be coupled to the connecting wirings 102 in one-to-one correspondence.

In an embodiment, the connecting electrodes 104 are coupled to first pads P1 on a light-emitting surface (i.e., a front face) of a display panel to be spliced in one-to-one correspondence.

In an embodiment, the first pads P1 are electrically coupled to display devices in the display area 20.

In the connecting substrate provided by the embodiment of the present disclosure, each display panel 107 to be spliced (see FIG. 7) may be placed in the panel area 10 of the connecting substrate, and adjacent display panels 107 may be spliced through the connecting substrate to form a splicing screen of a larger area, thereby implementing display in a larger area. In an embodiment, a drive chip 111 may be disposed on a back face of the display panel 107. In an embodiment, the drive chip 111 may be disposed between the connecting wiring 102 and the display panel 107, and electrically coupled to the connecting wiring 102. In this way, the drive chip 111 may be electrically coupled to the display device in the display panel 107 via the connecting wiring 102, the connecting electrode 104, and the first pad P1, to drive the display device in the display panel to display.

Figure 7:
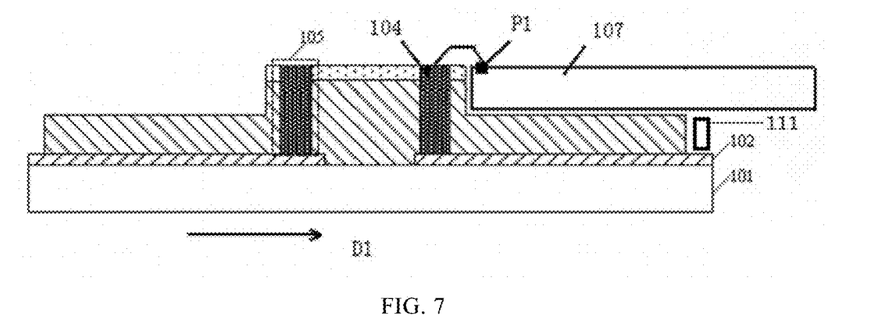
FIG. 7 is a schematic diagram showing a partial sectional structure of a connecting substrate according to an embodiment of the present disclosure.

During the splicing process, the display panel may be fixedly supported by the groove 106 formed on the insulating layer 103, and the first pads P1 on the front face of the display panel 107 may be electrically coupled to the connecting electrodes 104 by means of spot soldering or lead connection. In an embodiment, the display panel 107 may extend beyond the groove 106 in the first direction D1 parallel to the front face of the display panel. In other words, a size of the display panel in the first direction D1 is greater than a size of the groove 106 in the first direction D1. In an embodiment, the size of the display panel 107 in the first direction D1 is 2 to 10 times the size of the groove 106 in the first direction D1. In this way, a space for accommodating the drive chip 111 may be formed below the display panel 107.

In an embodiment, the drive chip 111 in communication with the display panel is electrically coupled to the first pads P1 on the display panel 107, and since the first pads P1 on the display panel 107 are coupled to the connecting wirings 102 via the connecting electrodes 104, the drive chip 111 for the display panel 107 may be disposed above the connecting wirings 102 without being disposed at a peripheral area (i.e., a fan-out area) of the display panel, thereby reducing a bezel size of the display panel 107. As a result, the gap between adjacent display panels in the splicing screen is reduced.

Furthermore, the connecting wirings 102 and the connecting electrodes 104 in the connecting substrate may be coupled to signal lines in the display panels, so that there is no need to reserve a large space for the signal line between adjacent display panels, and the gap between adjacent display panels in the splicing screen may be further reduced. In practical applications, a distance between adjacent display panels may be controlled by controlling a distance between adjacent connecting electrodes 104. As a result, the gap between adjacent display panels in the splicing screen is reduced, and finally small-gap or seamless splicing is achieved, which can reduce dark fringes at the splicing position of adjacent display panels, and thus improve the display effect.

It will be appreciated that the groove 106 formed on the insulating layer 103 of the connecting substrate may only fixedly support an edge of the display panel to be spliced, without supporting the entire back face of the display panel. During the fabrication process, the base 101 may be disposed only in all the connecting areas 30 and a portion of the display area near the spliced position, and another film layer or structure (e.g., a drive chip 111) may be formed on the base 101 to implement splicing of the display panel, which can save the fabricating raw materials and cost. In an embodiment, the groove 106 formed may have an area substantially the same as the fan-out area of the display panel to be spliced. The connecting wiring 102 may be electrically coupled to the drive chip 111 via a signal line, and since the drive chip has a relatively high power, two or more flexible circuit boards may be used for connecting the drive chip to the display panel.

In some embodiments, a depth of the groove 106 is equal to a thickness of the display panel to be spliced.

It should be noted that the depth of the groove 106 may be equal to the thickness of the display panel to be spliced so that the display panel to be spliced may be just placed in a space formed by the groove 106. Meanwhile, it can ensure that the light-emitting surfaces of adjacent display panels to be spliced are in the same plane so that the formed splicing screen has a relatively smooth surface, and the display effect is improved.

In some embodiments, the insulating layer 103 includes a polyimide layer 1031 and a silicon nitride layer 1032 disposed in stack. The polyimide layer 1031 is closer to the base 101 than the silicon nitride layer 1032. The groove 106 penetrates the silicon nitride layer 1032 and is located in the polyimide layer 1031. In other words, the depth of the groove 106 is greater than a thickness of the silicon nitride layer 1032 and smaller than a thickness of the insulating layer 103 (that is, smaller than a sum of the thickness of the polyimide layer 1031 and the thickness of the silicon nitride layer 1032). In an embodiment, the polyimide layer 1031 is made of a polyimide material, and the silicon nitride layer 1032 is made of a silicon nitride material.

It should be noted that the insulating layer 103 in the connecting substrate provided in the embodiment of the present disclosure may be formed by a multilayer structure, such as the polyimide layer 1031 and the silicon nitride layer 1032 disposed in stack. The polyimide layer 1031 is thicker than the silicon nitride layer 1032. The polyimide layer 1031, with better insulation properties and flexibility, can have a better insulation effect between the connecting wiring 102 and other signal lines in the display panel to be spliced, and the groove 106 formed thereon can provide good fixed support for the display panel to be spliced, while benefit to forming a flexible connecting substrate and realizing flexible splicing of the display panels. The silicon nitride layer 1032 has stable performance, and can well protect the covered polyimide layer 1031 during the whole fabrication process of the insulating layer 103, thereby forming an insulating layer 103 with a desired thickness. It will be appreciated that the insulating layer 103 may also be provided as a single layer structure having only one material, or a multilayer structure having various materials; the functions and implementation principles are similar and will not be repeated here.

In some embodiments, a material of the connecting electrode 104 includes copper.

It should be noted that the connecting electrode 104 may be formed by vapor deposition of copper on the seed layer. Due to the good electrical conductivity and low fabrication cost of copper, the use of the copper electrode may save the fabrication cost. It will be appreciated that the connecting electrode 104 may also be made of other metal materials or metal oxide materials with good electrical conductivity, which are not enumerated here.

In some embodiments, the base 101 includes a flexible base.

It should be noted that the base 101 may be made of a flexible material such as polyimide, so that a flexible connecting substrate and thus flexible connection of the display panels are achieved. It will be appreciated that the base 101 may also be made of a rigid material such as glass, which may improve strength of the connecting substrate, while reducing the fabrication cost of the connecting substrate since the cost of the glass base is lower. In practical applications, the material of the base 101 may be selected according to practical requirements, and will not be described in detail herein.

Figure 4:
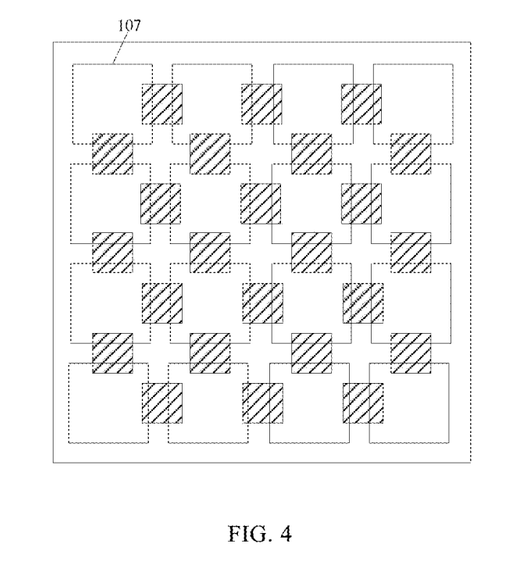
FIG. 4 is a schematic structural diagram of a splicing screen according to an embodiment of the present disclosure.

An embodiment of the present disclosure provides a splicing screen. FIG. 4 is a schematic structural diagram of a splicing screen according to an embodiment of the present disclosure. As shown in FIG. 4, the splicing screen includes a connecting substrate as provided in any one of the above embodiments. The splicing screen further includes: a plurality of display panels 107 arranged in a matrix. First pads P1 on a light-emitting surface (i.e., a front face) of each display panel are coupled to connecting electrodes 104 in the connecting substrate in one-to-one correspondence.

It should be noted that a drive chip 111 is disposed on a back face of the display panel, first pads P1 coupled to a display device may be provided on the front face of the display panel 107, and the drive chip 111 is used to provide a drive signal for the display device for display. In practical applications, the display panel 107 may be fixedly supported by a groove 106 formed on an insulating layer 103, and the first pads P1 on the front face of the display panel 107 may be electrically coupled to the connecting electrodes 104 by means of spot soldering or lead connection. Since the connecting electrodes 104 and the connecting wirings 102 are coupled in one-to-one correspondence through the through holes 105, the drive chip 111 on the back face of the display panel 107 may be coupled to the first pads P1 on the front face of the display panel 107 in one-to-one correspondence by the connecting wirings 102 and the connecting electrodes 104 in the connecting substrate. As a result, there is no need for each display panel to reserve a fan-out area with a large area for bonding the display panel with the drive chip 111, thereby reducing a bezel of each display panel, and thus reducing a gap between adjacent display panels in the splicing screen. Furthermore, the connecting wirings 102 and the connecting electrodes 104 in the connecting substrate may be coupled to signal lines in the display panels so that there is no need to reserve a large space for the signal line between adjacent display panels, and the gap between adjacent display panels in the splicing screen may be further reduced. In practical applications, a distance between adjacent display panels may be controlled by controlling a distance between adjacent connecting electrodes 104. As a result, the gap between adjacent display panels in the splicing screen is reduced, and finally small-gap or seamless splicing is achieved, which can reduce dark fringes at the splicing position of adjacent display panels, and thus improve the display effect.

In some embodiments, the display panel 107 includes an active matrix organic light-emitting diode display panel or a passive matrix organic light-emitting diode display panel.

It should be noted that the display panel 107 may be an active matrix organic light-emitting diode display panel or a passive matrix organic light-emitting diode display panel. In this way, the splicing screen provided by the embodiments of the present disclosure may be a splicing screen formed by splicing an active matrix organic light-emitting diode display panel with an active matrix organic light-emitting diode display panel, or a splicing screen formed by splicing an active matrix organic light-emitting diode display panel with a passive matrix organic light-emitting diode display panel, or a splicing screen formed by splicing a passive matrix organic light-emitting diode display panel with a passive matrix organic light-emitting diode display panel. In practical applications, the type of the display panel 107 may be selected according to practical requirements, and will not be described in detail herein.

Based on the same inventive concept, an embodiment of the present disclosure provides a display apparatus, including a splicing screen as provided in any of the above embodiments. The display apparatus may be applied to various scenarios such as conference rooms, movie theaters, multifunctional rooms or other indoor scenarios that need large-screen display. The implementation principles of the display apparatus are similar to those of the splicing screen and the connecting substrate provided in the above embodiments, and will not be described in detail herein.

Figure 5:
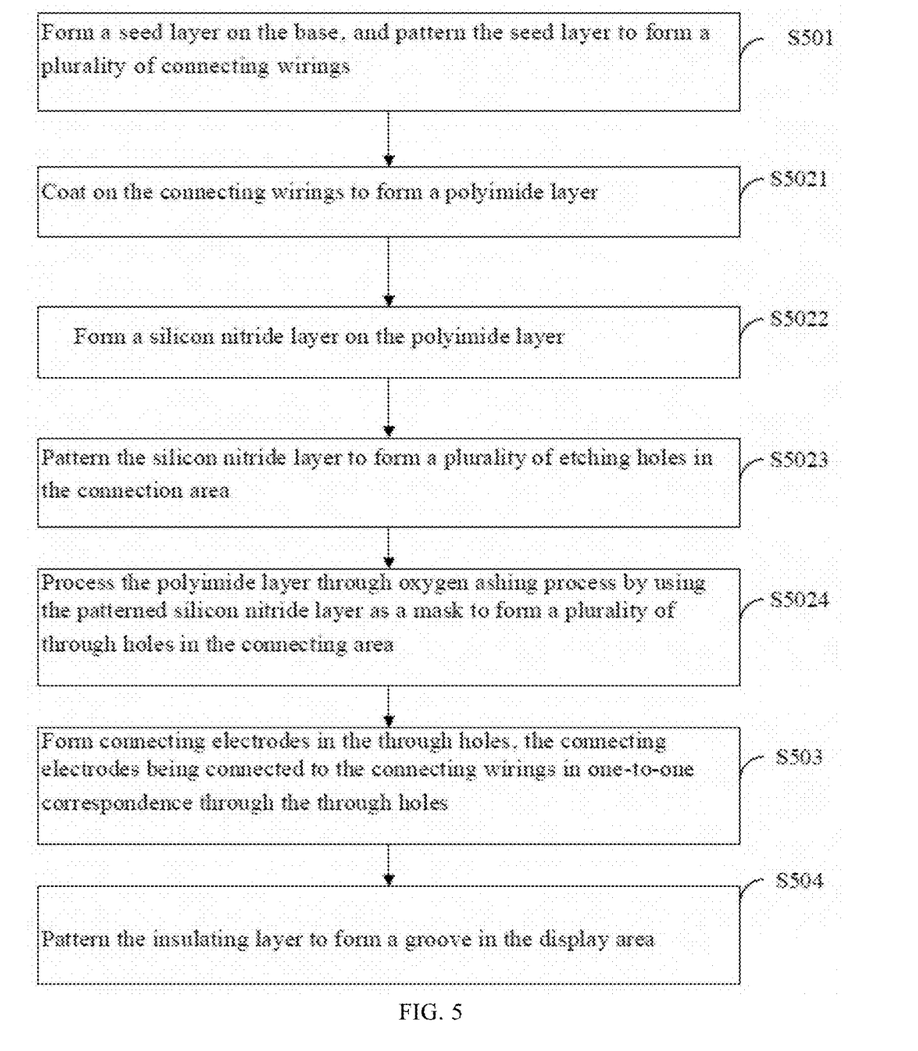
FIG. 5 is a schematic flowchart of a method for fabricating a connecting substrate according to an embodiment of the present disclosure.

An embodiment of the present disclosure provides a method for fabricating a connecting substrate. FIG. 5 is a schematic flowchart of a method for fabricating a connecting substrate according to an embodiment of the present disclosure. The connecting substrate has a plurality of panel areas each including a display area and a connecting area around the display area. As shown in FIG. 5, the method for fabricating a connecting substrate includes the following steps S501 to S504.

Step S501 includes forming a seed layer on the base, and patterning the seed layer to form a plurality of connecting wirings located on the base and in the connecting area.

Figure 6A:
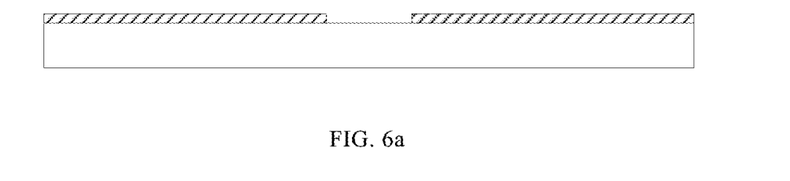
FIG. 6a is a schematic structural diagram corresponding to step S501 in a method for fabricating a connecting substrate according to an embodiment of the present disclosure.

It should be noted that, as shown in FIG. 6a, a metal layer may be deposited on the base to form a full seed layer. The plurality of connecting wirings may be formed in the connecting area by etching the full seed layer according to the number and width of the connecting wirings.

Step S502 includes forming an insulating layer covering the plurality of connecting wirings, and patterning the insulating layer to form a plurality of through holes in the connecting area.

Figure 6B:
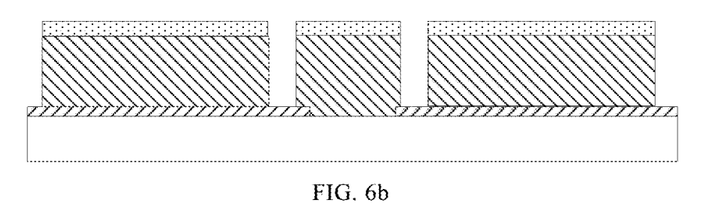
FIG. 6b is a schematic structural diagram corresponding to step S502 in a method for fabricating a connecting substrate according to an embodiment of the present disclosure.

As shown in FIG. 6b, an insulating layer, which may be a double-layer structure, may be formed on the plurality of connecting wirings. In an embodiment, the method may include the following steps S5021 to S5022. Step S5021 includes coating on the connecting wirings to form a polyimide layer. Step S5022 includes forming a silicon nitride layer on the polyimide layer. Thereafter, the double-layer insulating layer formed by the polyimide layer and the silicon nitride layer are patterned. For example, step S502 may include the following steps S5023 to S5024. Step S5023 includes patterning the silicon nitride layer to form a plurality of etching holes in the connection area. Step S5024 includes processing the polyimide layer through oxygen ashing process by using the patterned silicon nitride layer as a mask to form a plurality of through holes in the connecting area. The silicon nitride layer has stable performance, and the patterned silicon nitride layer may be used as a mask for the polyimide layer to shield the polyimide layer so that through holes are formed at preset positions.

Step S503 includes forming connecting electrodes in the through holes, the connecting electrodes being coupled to the connecting wirings in one-to-one correspondence through the through holes.

Figure 6C:
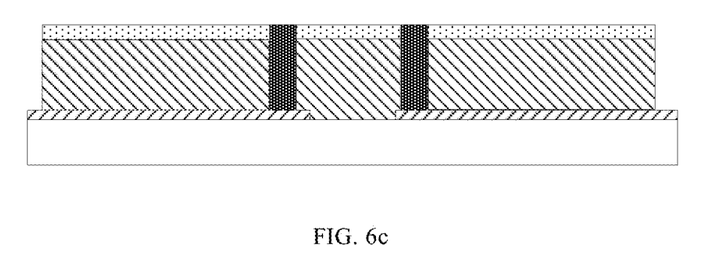
FIG. 6c is a schematic structural diagram corresponding to step S503 in a method for fabricating a connecting substrate according to an embodiment of the present disclosure.

It should be noted that, as shown in FIG. 6c, copper may be injected into the through holes by electroplating, to form copper electrodes, i.e., connecting electrodes, in the through holes, and to make the connecting electrodes and the connecting wirings be coupled in one-to-one correspondence through the through holes.

Step S504 includes patterning the insulating layer to form grooves in the display area.

Figure 6D:
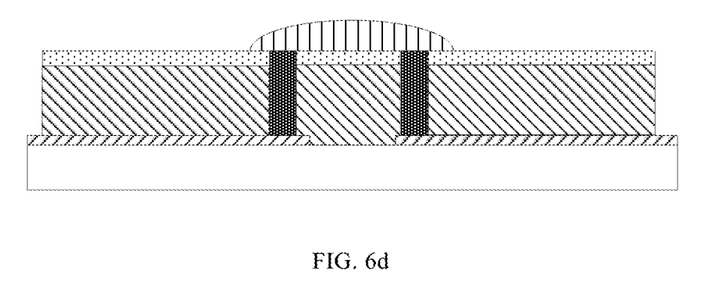
FIGS. 6d, 6e and 6f are schematic structural diagrams corresponding to step S504 in a method for fabricating a connecting substrate according to an embodiment of the present disclosure.
Figure 6E:
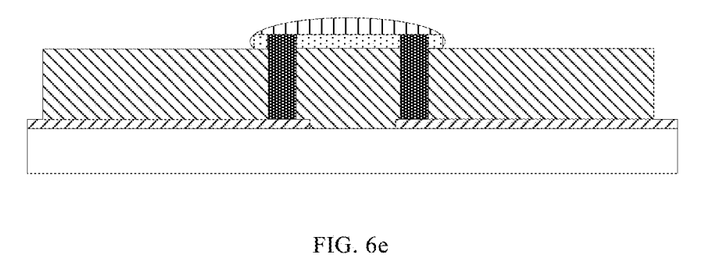
Figure 6F:
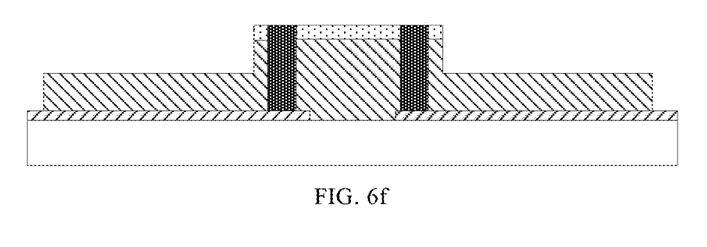

It should be noted that, as shown in FIGS. 6d, 6e and 6f, the connecting electrodes may be shielded by a photoresist. The silicon nitride layer in the display area is firstly etched to expose the polyimide layer, and then the polyimide layer is subjected to oxygen ashing so that the grooves are formed in the polyimide layer. Finally, the photoresist covering the connecting electrodes is removed, and an oxide layer of the connecting electrodes is cleaned with an acid solution, thereby forming the connecting substrate.

In the connecting substrate formed by the fabrication method provided in the embodiments of the present disclosure, the display panel to be spliced may be fixedly supported by the groove formed on the insulating layer, and since the first pads on the display panel are coupled to the connecting wirings via the connecting electrodes, the drive chip for the display panel may be disposed above the connecting wirings without being disposed at a peripheral area (i.e., a fan-out area) of the display panel, thereby reducing a bezel size of the display panel. As a result, the gap between adjacent display panels in the splicing screen is reduced.

Furthermore, the connecting wirings and the connecting electrodes in the connecting substrate may be coupled to signal lines in the display panels so that there is no need to reserve a large space for the signal line between adjacent display panels, and the gap between adjacent display panels in the splicing screen may be further reduced. In practical applications, a distance between adjacent display panels may be controlled by controlling a distance between adjacent connecting electrodes. As a result, the gap between adjacent display panels in the splicing screen is reduced, and finally small-gap or seamless splicing is achieved, which can reduce dark fringes at the splicing position of adjacent display panels, and thus improve the display effect.

It will be appreciated that the above implementations are merely exemplary implementations for the purpose of illustrating the principle of the present disclosure, and the present disclosure is not limited thereto. Various modifications and improvements can be made by a person having ordinary skill in the art without departing from the spirit and essence of the present disclosure. Accordingly, all of the modifications and improvements also fall into the protection scope of the present disclosure.

What is claimed is:

1. A splicing screen, comprising a connecting substrate and a plurality of display panels,
wherein the connecting substrate has a plurality of panel areas and connecting areas configured to connect every two adjacent panel areas among the plurality of panel areas, each panel area comprising a display area surrounded by the connecting areas,
wherein the connecting substrate comprises:
a base;
a plurality of connecting wirings, in each connecting area, located on the base;
an insulating layer covering the plurality of connecting wirings and define a plurality of grooves for accommodating the plurality of display panels respectively;
a plurality of through holes, in each connecting area, penetrating the insulating layer; and
a plurality of connecting electrodes, in each connecting area, respectively provided in the plurality of through holes and coupled to the plurality of connecting wirings in one-to-one correspondence; and
a plurality of first pads, in each connecting area, located on a light-emitting surface of the display panel,
wherein the plurality of connecting electrodes are coupled to the plurality of first pads in one-to-one correspondence.

2. The splicing screen according to claim 1, wherein
the light-emitting surface of the display panel is on a side of the display panel away from the base;
the splicing screen further comprises a plurality of drive chips each for driving the display panel;
and the drive chip is between the display panel and the connecting wiring, and is coupled to the connecting wiring.

3. The splicing screen according to claim 2, wherein
a size of the display panel in a first direction parallel to a front face of the display panel is 2 to 10 times a size of the groove in the first direction.

4. The splicing screen according to claim 2, wherein the display panel comprises an active matrix organic light-emitting diode display panel or a passive matrix organic light-emitting diode display panel.

5. A display apparatus, comprising a splicing screen according to claim 1.

6. A method for fabricating a splicing screen comprising a connecting substrate and a plurality of display panels,
wherein the connecting substrate that has a plurality of panel areas and connecting areas configured to connect every two adjacent panel areas among the plurality of panel areas, each panel area comprising a display area surrounded by the connecting areas,
wherein the connecting substrate comprises:
a base;
a plurality of connecting wirings, in each connecting area, located on the base;
an insulating layer covering the plurality of connecting wirings and define a plurality of grooves for accommodating the plurality of display panels respectively;
a plurality of through holes, in each connecting area, penetrating the insulating layer; and
a plurality of connecting electrodes, in each connecting area, respectively provided in the plurality of through holes and coupled to the plurality of connecting wirings in one-to-one correspondence; and
a plurality of first pads, in each connecting area, located on a light-emitting surface of the display panel,
wherein the plurality of connecting electrodes are coupled to the plurality of first pads in one-to-one correspondence,
wherein the method for fabricating the connecting substrate comprises:
forming a seed layer on the base, and patterning the seed layer to form the plurality of connecting wirings;
forming the insulating layer covering the plurality of connecting wirings, and patterning the insulating layer to form the plurality of through holes in the connecting area;
forming the plurality of connecting electrodes in the plurality of through holes, wherein the plurality of connecting electrodes are coupled to the plurality of connecting wirings in one-to-one correspondence through the plurality of through holes; and
patterning the insulating layer to form the groove in the display area.

7. The method for fabricating the connecting substrate according to claim 6,
wherein the forming the insulating layer covering the plurality of connecting wirings comprises:
forming a polyimide layer on the plurality of connecting wirings; and
forming a silicon nitride layer on the polyimide layer.

8. The method for fabricating the connecting substrate according to claim 7,
wherein the patterning the insulating layer to form the plurality of through holes in the connecting area comprises:
patterning the silicon nitride layer to form a plurality of etching holes; and
processing the polyimide layer through oxygen ashing process by using the patterned silicon nitride layer as a mask to form the plurality of through holes in the connecting area.

9. The splicing screen according to claim 1, wherein
in each connecting area, the plurality of connecting wirings extending in a same direction.

10. The splicing screen according to claim 2, wherein a depth of the groove is equal to a thickness of the display panel.

11. The connecting substrate according to claim 1, wherein the insulating layer comprises
a polyimide layer and a silicon nitride layer disposed in stack; and
the polyimide layer is closer to the base than the silicon nitride layer; and the groove penetrates the silicon nitride layer and is located in the polyimide layer.

12. The connecting substrate according to claim 1, wherein a material of the connecting electrode comprises copper.

13. The connecting substrate according to claim 1, wherein the base comprises a flexible base.

14. The connecting substrate according to claim 1, wherein in each connecting area, the connecting substrate comprises two columns of connecting electrodes, one column of connecting electrodes being electrically coupled to the first pads on the light-emitting surface of the display panel, and the other column of connecting electrodes being electrically coupled to the first pads on the light-emitting surface of another display panel, which is adjacent to the display panel.

15. The connecting substrate according to claim 1, wherein in each connecting area, the plurality of connecting wirings comprise two columns of connecting wirings, and each of the two columns of connecting wirings extends in a direction perpendicular to a column direction.

\* \* \* \* \*